(12) United States Patent
Chen et al.

(10) Patent No.: US 10,032,608 B2
(45) Date of Patent: *Jul. 24, 2018

(54) APPARATUS AND METHOD FOR TUNING ELECTRODE IMPEDANCE FOR HIGH FREQUENCY RADIO FREQUENCY AND TERMINATING LOW FREQUENCY RADIO FREQUENCY TO GROUND

(71) Applicant: Applied Materials, Inc., Santa Clara, CA (US)

(72) Inventors: Jian J. Chen, Fremont, CA (US); Juan Carlos Rocha-Alvarez, San Carlos, CA (US); Mohamad A. Ayoub, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 506 days.

This patent is subject to a terminal disclaimer.

(21) Appl. No.: 14/215,676

(22) Filed: Mar. 17, 2014

(65) Prior Publication Data

US 2014/0290576 A1 Oct. 2, 2014

Related U.S. Application Data

(60) Provisional application No. 61/805,881, filed on Mar. 27, 2013, provisional application No. 61/884,364, filed on Sep. 30, 2013.

(51) Int. Cl.
*H01L 21/00* (2006.01)
*C23C 16/00* (2006.01)
*H01J 37/32* (2006.01)

(52) U.S. Cl.
CPC .. *H01J 37/32183* (2013.01); *H01J 37/32091* (2013.01)

(58) Field of Classification Search
None
See application file for complete search history.

(56) References Cited

U.S. PATENT DOCUMENTS 4,464,223 A * 8/1984 Gorin ................. C23F 4/00
156/345.45
5,605,576 A * 2/1997 Sasaki .................. C23C 14/35
118/723 E (Continued)

FOREIGN PATENT DOCUMENTS

JP 61119686 A 6/1986
JP 8-316212 A 11/1996

(Continued)

OTHER PUBLICATIONS

International Search Report and Written Opinion, PCT/US2014/016107, dated May 28, 2014.

(Continued)

*Primary Examiner* — Parviz Hassanzadeh
*Assistant Examiner* — Michelle Crowell
(74) *Attorney, Agent, or Firm* — Patterson + Sheridan, LLP

(57) ABSTRACT

Embodiments of the present invention relate to apparatus for improving uniformity and film stress of films deposited during plasma process of a substrate. According to embodiments, the apparatus includes a tuning electrode and/or a tuning ring electrically coupled to a variable capacitor for tuning high frequency RF impedance of the electrode and a low frequency RF termination to ground. The plasma profile and resulting film thickness can be controlled by adjusting the capacitance of the variable capacitor and the resulting impedance of the tuning electrode. The film stress of the film deposited on the substrate can be controlled, i.e., increased, by terminating the low frequency RF during processing.

15 Claims, 4 Drawing Sheets

(56) References Cited

U.S. PATENT DOCUMENTS

| | | | |
|---|---|---|---|
| 6,706,138 B2* | 3/2004 | Barnes | H01J 37/3244 156/345.1 |
| 7,004,107 B1 | 2/2006 | Raoux et al. | |
| 8,778,813 B2 | 7/2014 | Sankarakrishnan et al. | |
| 2006/0196605 A1 | 9/2006 | Ikegami et al. | |
| 2007/0006972 A1 | 1/2007 | Piptone et al. | |
| 2007/0023398 A1* | 2/2007 | Kobayashi | H01J 37/32027 219/69.12 |
| 2008/0084560 A1* | 4/2008 | Zhang | G01J 3/02 356/317 |
| 2008/0180357 A1* | 7/2008 | Kawakami | H01J 37/32091 345/60 |
| 2009/0229969 A1* | 9/2009 | Hoffman | C23C 14/35 204/192.12 |
| 2009/0230089 A1* | 9/2009 | Bera | H01J 37/32009 216/67 |
| 2009/0236214 A1* | 9/2009 | Janakiraman | C23C 16/45565 204/164 |
| 2010/0018648 A1 | 1/2010 | Collins et al. | |
| 2010/0213047 A1 | 8/2010 | Nagamine et al. | |
| 2010/0252198 A1 | 10/2010 | Yamazawa et al. | |
| 2010/0252417 A1* | 10/2010 | Allen | C23C 14/345 204/192.12 |
| 2011/0294303 A1* | 12/2011 | Sankarakrishnan | C23C 16/46 438/758 |
| 2012/0164834 A1 | 6/2012 | Jennings et al. | |
| 2013/0288483 A1* | 10/2013 | Sadjadi | H01L 21/02104 438/710 |
| 2014/0302256 A1* | 10/2014 | Chen | C23C 16/46 427/569 |
| 2016/0013022 A1* | 1/2016 | Ayoub | H01J 37/32091 427/569 |
| 2016/0017494 A1* | 1/2016 | Ayoub | H01J 37/32091 427/569 |

FOREIGN PATENT DOCUMENTS

| | | | |
|---|---|---|---|
| JP | 2000-188284 A | | 7/2000 |
| JP | 2004193567 A | | 7/2004 |
| JP | 2005235432 A | * | 9/2005 |

OTHER PUBLICATIONS

International Search Report and Written Opinion, PCT/US2014/016098, dated Jun. 9, 2014.

* cited by examiner

APPARATUS AND METHOD FOR TUNING ELECTRODE IMPEDANCE FOR HIGH FREQUENCY RADIO FREQUENCY AND TERMINATING LOW FREQUENCY RADIO FREQUENCY TO GROUND

CROSS-REFERENCE TO RELATED APPLICATIONS

This application claims benefit of U.S. provisional patent application Ser. Nos. 61/805,881, filed Mar. 27, 2013 and 61/884,364 filed Sep. 30, 2013, which are herein incorporated by reference.

BACKGROUND OF THE INVENTION

Field of the Invention

Embodiments of the present invention generally relate to an apparatus and method for processing substrates. More particularly, embodiments of the present invention relate to an apparatus for tuning electrode impedance for high frequency radio frequency (RF) and terminating low frequency RF to ground.

Description of the Related Art

Plasma processing, such as plasma enhanced chemical vapor deposition (PECVD), is used to deposit materials, such as blanket dielectric films on substrates, such as semiconductor wafers. A challenge for current plasma processing chambers and processes includes controlling critical dimension uniformity during plasma deposition processes. One challenge includes substrate center to edge thickness uniformity in films deposited using current plasma processing chambers and techniques. An additional challenge includes controlling the film stress in films deposited using current plasma processing chambers and techniques.

Accordingly, it is desirable to develop an apparatus for both improving center to edge thickness uniformity and film stress of films deposited during plasma processing.

SUMMARY OF THE INVENTION

In one embodiment of the present invention, a plasma processing apparatus comprises a chamber body and a powered gas distribution manifold enclosing a process volume, a pedestal disposed in the process volume for supporting a substrate, and a tuning electrode disposed within the pedestal and electrically coupled to a first capacitor and a first inductor to ground, wherein the first capacitor and the first inductor are configured in parallel.

In another embodiment, a substrate support assembly for use in a plasma processing apparatus comprises a substrate support pedestal, a tuning electrode disposed within the substrate support pedestal, a first capacitor electrically coupled to the tuning electrode, and an inductor configured in parallel with the first capacitor.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention relate to apparatus for improving uniformity and film stress of films deposited during plasma process of a substrate. According to embodiments, the apparatus includes a tuning electrode and/or a tuning ring electrically coupled to a variable capacitor for tuning high frequency RF impedance of the electrode and a low frequency RF termination to ground. The plasma profile and resulting film thickness can be controlled by adjusting the capacitance of the variable capacitor and the resulting impedance of the tuning electrode. The film stress of the film deposited on the substrate can be controlled, i.e., increased, by terminating the low frequency RF during processing.

Figure 1:
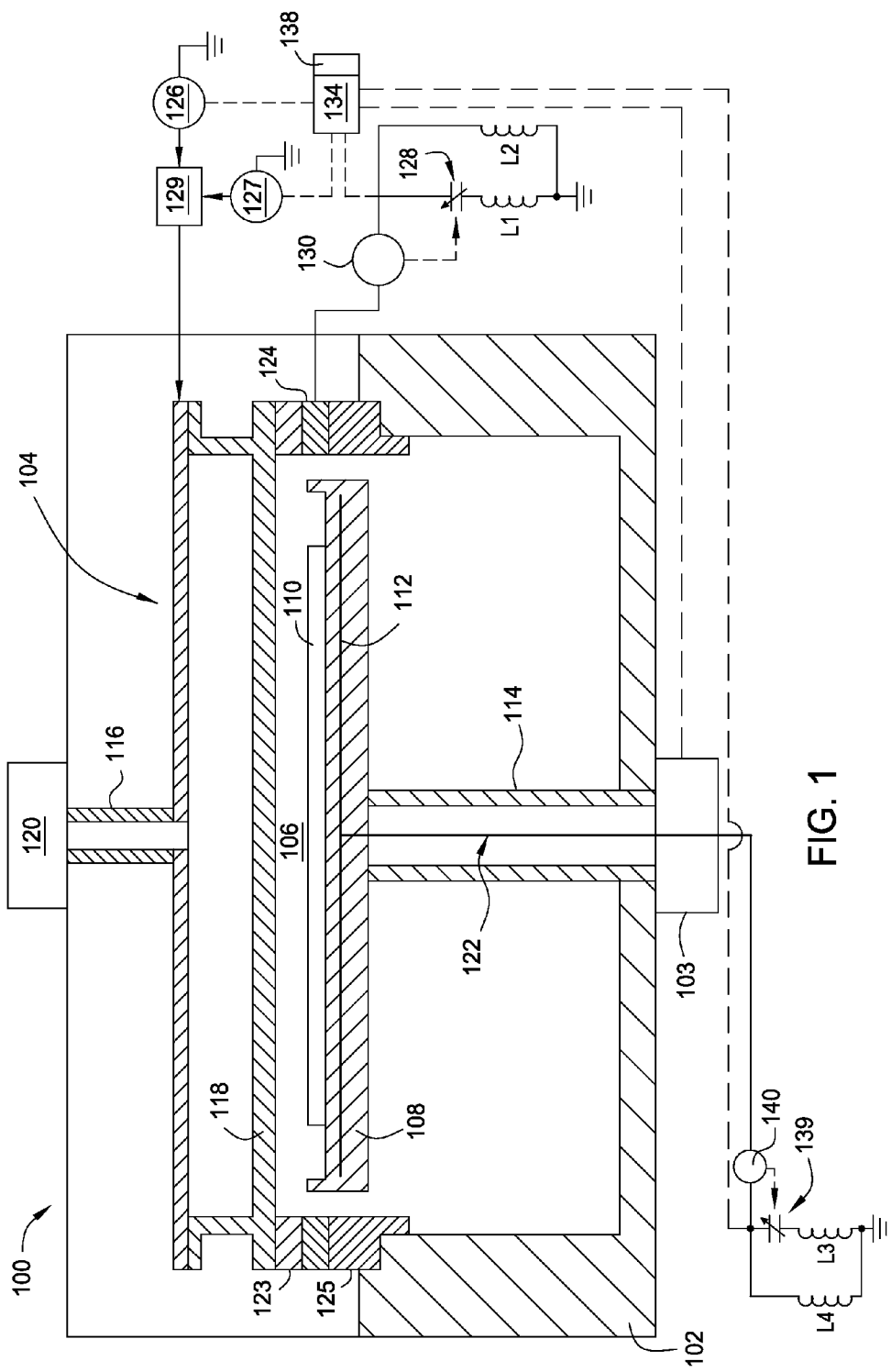
FIG. 1 is a schematic depiction of a plasma processing chamber according to an embodiment.

FIG. 1 is a schematic, cross-sectional view of a plasma processing apparatus according to one embodiment of the present invention. The apparatus includes a chamber 100 in which one or more films may be deposited on a substrate 110. The chamber includes a chamber body 102 and a gas distribution assembly 104, which distributes gases uniformly into a process volume 106. A pedestal 108 is disposed within the process volume 106 and supports the substrate 110. The pedestal 108 includes a heating element (not shown). The pedestal 108 is movably disposed in the process volume 106 by a stem 114 that extends through the chamber body 102, where it is connected to a drive system 103 for raising, lowering, and/or rotating the pedestal 108.

The gas distribution assembly 104 includes a gas inlet passage 116, which delivers gas from a gas flow controller 120 into a gas distribution manifold 118. The gas distribution manifold 118 includes a plurality of nozzles (not shown) through which gaseous mixtures are injected during processing.

A high frequency RF power source 126 and a low frequency RF power source 127 provide electromagnetic energy through a match circuit 129 to power the gas distribution manifold 118, which acts as a powered electrode, to facilitate generation of a plasma between the gas distribution manifold 118 and the pedestal 108. The pedestal 108 includes a tuning electrode 112, which is electrically grounded through an RF rod 122 such that an electric field is generated in the chamber 100 between the powered gas distribution manifold 118 and the tuning electrode 112. In one embodiment, the tuning electrode 112 comprises a conductive mesh, such as an aluminum or molybdenum mesh.

A ceramic ring 123 is positioned below the gas distribution manifold 118. A tuning ring 124 is disposed between the ceramic ring 123 and an isolator 125, which isolates the tuning ring 124 from the chamber body 102. The tuning ring 124 is made from a conductive material, such as aluminum. As depicted in FIG. 1, the tuning ring 124 is positioned concentrically about the pedestal 108 and substrate 110 during processing of the substrate 110. The tuning ring 124 is electrically coupled to a variable capacitor 128, such as a variable vacuum capacitor, and terminated to ground through an inductor L1. A second inductor L2 is electrically coupled in parallel to the variable capacitor 128 to provide a path for low frequency RF to ground. In addition, a sensor 130, such as a VI sensor, is positioned between the tuning ring 124 and the variable capacitor 128 for use in controlling the current flow through the tuning ring 124 and the variable capacitor 128.

The tuning electrode 112 is electrically coupled to a variable capacitor 139, such as a variable vacuum capacitor, and terminated to ground through an inductor L3. A second inductor L4 is electrically coupled in parallel to the variable capacitor 139 to provide a path for low frequency RF to ground. In addition, a sensor 140, such as a VI sensor, is positioned between the tuning electrode 112 and the variable capacitor 139 for use in controlling the current flow through the tuning electrode 112 and the variable capacitor 139.

A system controller 134 controls the functions of the various components, such as the RF power sources 126 and 127, the drive system 103, and the variable capacitors 128 and 139. The system controller 134 executes system control software stored in a memory 138.

Thus, an RF path is established between the powered gas distribution manifold 118 and the tuning electrode 112 via plasma. Further, by changing the capacitance of the variable capacitor 139, the impedance for the RF path through the tuning electrode 112 changes, in turn, causing a change in the RF field coupled to the tuning electrode 112. Therefore, the plasma in the process volume 106 may be modulated across the surface of the substrate 110 during plasma processing.

Further, an additional RF path is established between the powered gas distribution manifold 118 and the tuning ring 124. Additionally, by changing the capacitance of the variable capacitor 128, the impedance for the RF path through the tuning ring 124 changes, in turn, causing a change in the RF field coupled to the tuning ring 124. For example, a maximum current and corresponding minimum impedance of the tuning ring 124 can be achieved by varying the total capacitance of the variable capacitor 128. Therefore, the plasma in the process volume 106 may be modulated across the surface of the substrate 110 during plasma processing.

Figure 2:
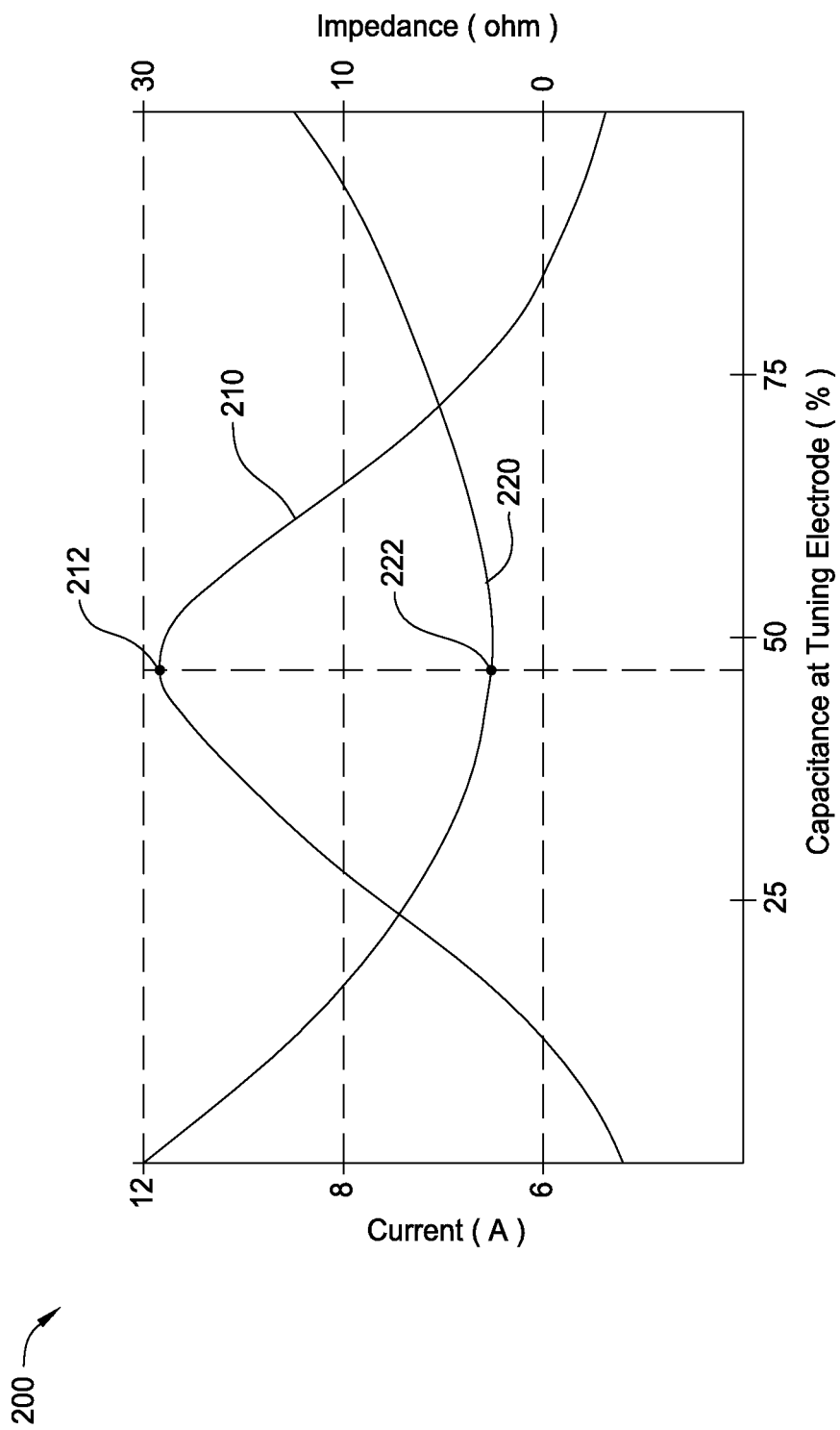
FIG. 2 is an exemplary depiction of the total current and the total impedance, of the tuning electrode of FIG. 1, plotted as a function of the percentage of capacitance of the total capacitance at the variable capacitor coupled to the tuning electrode.

FIG. 2 is an exemplary depiction of the total current 210 and the total impedance 220, of the tuning electrode 112 of FIG. 1, plotted as a function of the percentage of capacitance of the total capacitance at the variable capacitor 139. As can be seen in this example, the maximum current 212 and corresponding minimum impedance 222 of the tuning electrode 112 (i.e., resonance) is achieved at between about 40% and 50% of the total capacitance of the variable capacitor 139. This is due to the resonance of a series LC circuit formed by the inductive RF rod 122, the inductor L3, and the variable capacitor 139. By tuning the variable capacitor 139 to the resonance, the inductive impedance of the RF rod 122 can be canceled, and the overall impedance for this RF return path (i.e., from the top surface of the pedestal 108, through the tuning electrode 112, and through the RF rod 122) is minimized, resulting in the maximum possible current flowing through the tuning electrode 112, and thereby enhancing deposition rate. At lower and higher percentages of the total capacitance of the variable capacitor 139, the total current 210 decreases, while the corresponding total impedance 220 increases. Accordingly, a desired current and total impedance of the tuning electrode 112 can be modulated by controlling the total capacitance at the variable capacitor 139.

Referring back to FIG. 1, as described above, the inductor L4 (e.g., 5 µH inductor) is coupled in parallel to the variable capacitor 139 to provide a path for low frequency RF to ground. The low frequency RF termination through the bottom electrode 112 allows greater sensitivity in tuning film stress in films deposited during plasma processing. For example, by terminating the low frequency RF, more low frequency RF is returned to the electrode 112 through the substrate 110. As a result, the substrate 110 is bombarded by low frequency RF, resulting in higher film stress in the film being deposited on the substrate 110.

Figure 3:
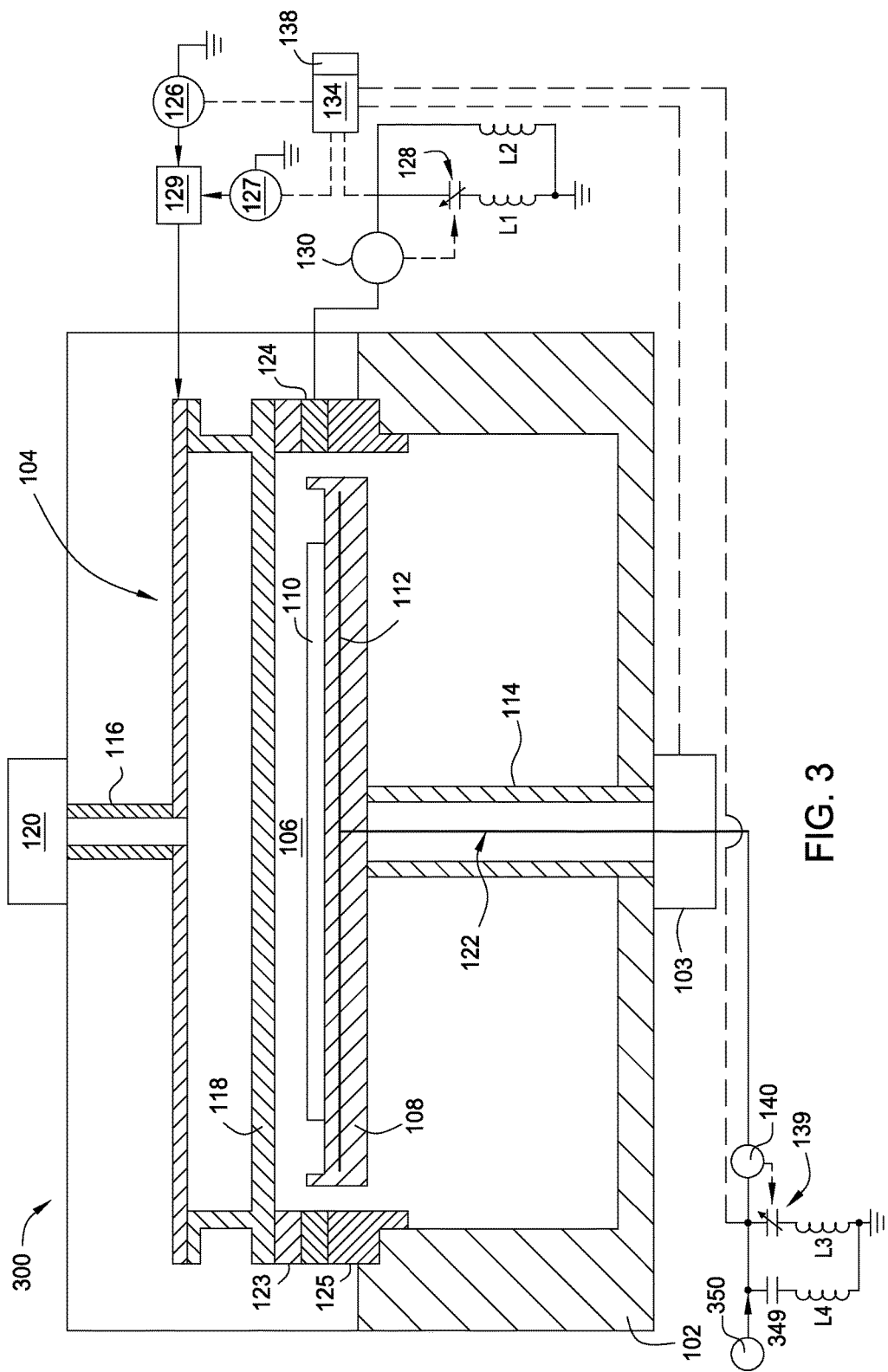
FIG. 3 is an exemplary depiction of a plasma processing chamber in accordance with another embodiment.

FIG. 3 is an exemplary depiction of a processing chamber 300 in accordance with another embodiment. Many of the features of the processing chamber 300 are the same as those of the processing chamber 100 and will not be repeated here. In the processing chamber 300, a capacitor 349 is provided in series with the inductor L4, such that the low frequency RF from the electrode 112 is terminated through a series LC circuit. In one embodiment, the capacitor 349 and inductor L4 are selected and tuned such that they are in resonance having opposite impedance, which cancel one another to provide very low total impedance of the low frequency RF through the electrode 112. In addition, a high DC voltage source 350 is electrically coupled with the electrode 112 in order to provide a chucking voltage to the electrode 112 to electrostatically clamp the substrate 110 to the pedestal 108 during processing. The capacitor 349 provides electrical isolation from ground needed to allow the chucking voltage to be applied to the electrode 112.

Figure 4:
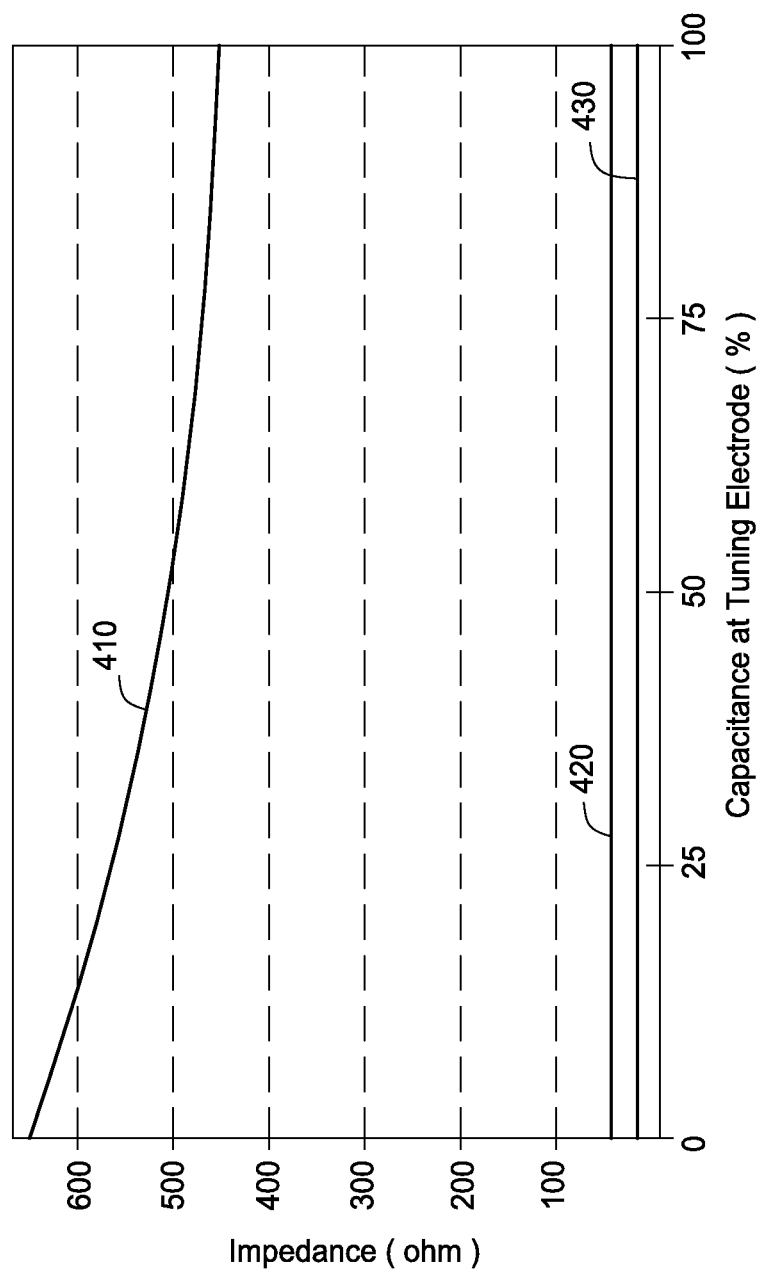
FIG. 4 is an exemplary depiction of the calculated total low frequency impedance at the top surface of the pedestal from FIGS. 1 and 3 plotted as a function of the percentage of capacitance of the total capacitance at the variable capacitor coupled to the tuning electrode.

FIG. 4 is an exemplary depiction of the calculated total low frequency impedance at the top surface of the pedestal 108 from FIGS. 1 and 3 plotted as a function of the percentage of capacitance of the total capacitance at the variable capacitor 139. Line 410 is a plot of the total impedance at low frequency without any low frequency grounding. As can be seen, with no low frequency termination, the low frequency impedance through the electrode 112 is very high such that there is very little low frequency bombardment at the substrate 110, resulting in low film stress of the film deposited on the substrate 110 during processing.

Line 420 is a plot of the total impedance at low frequency in accordance with the configuration depicted in FIG. 1, i.e., low frequency termination through the inductor L4, e.g., 5 µH inductor. As can be seen, the total impedance is significantly lowered as compared to Line 410, resulting in significantly higher low frequency bombardment of the substrate 110 and significantly higher film stress of the film deposited on the substrate 110 during processing.

Line 430 is a plot of the total impedance at a low frequency in accordance with the configuration depicted in FIG. 3, i.e., low frequency termination through LC series circuit, e.g., 27.5 µH inductor in series with 80 nF capacitor. As can be seen, the total impedance is lowered to near zero, resulting in very high low frequency bombardment of the substrate 110 and even higher film stress of the film deposited on the substrate 110 during processing.

While the foregoing is directed to embodiments of the present invention, other and further embodiments of the invention may be devised without departing from the basic scope thereof, and the scope thereof is determined by the claims that follow.

The invention claimed is:

1. A plasma processing apparatus, comprising:
   a chamber body and a powered gas distribution manifold enclosing a process volume;
   a pedestal disposed in the process volume for supporting a substrate;
   a tuning electrode disposed within the pedestal and connected directly to a first terminal of a tuning electrode capacitor further having a second terminal, the second terminal of the tuning electrode capacitor connected directly to a first terminal of a first tuning electrode inductor further having a second terminal attachable directly to ground, wherein the first terminal of the tuning electrode capacitor is connected directly to a first terminal of a second tuning electrode inductor further having a second terminal attachable directly to ground, wherein the tuning electrode capacitor is directly connected in series with the first tuning electrode inductor and wherein the tuning electrode capacitor and the first tuning electrode inductor are directly connected in parallel with the second tuning electrode inductor; and
   a conductive tuning ring disposed between the chamber body and the powered gas distribution manifold.

2. The plasma processing apparatus of claim 1, wherein the tuning electrode capacitor is a variable capacitor.

3. The plasma processing apparatus of claim 2, wherein the tuning electrode capacitor is coupled to a sensor and a controller configured to control the capacitance of the tuning electrode capacitor.

4. The plasma processing apparatus of claim 1, wherein the tuning electrode capacitor is a first tuning electrode capacitor and the apparatus further comprises a second tuning electrode capacitor in series with the first tuning electrode inductor.

5. The plasma processing apparatus of claim 4, wherein the tuning electrode is electrically coupled to a DC power source.

6. The plasma processing apparatus of claim 1, wherein the conductive tuning ring is electrically coupled to a tuning ring capacitor and a tuning ring inductor to ground, wherein the tuning ring capacitor and the tuning ring inductor are configured in parallel.

7. The plasma processing apparatus of claim 6, wherein the tuning ring capacitor is a variable capacitor.

8. The plasma processing apparatus of claim 7, wherein the tuning ring capacitor is coupled to a sensor and a controller configured to control the capacitance of the tuning ring capacitor.

9. A substrate support assembly for use in a plasma processing apparatus, comprising:
   a substrate support pedestal;
   a tuning electrode disposed within the substrate support pedestal;
   a tuning electrode capacitor having a first terminal and a second terminal, the first terminal of the tuning electrode capacitor connected directly to the tuning electrode;
   a first tuning electrode inductor having a first terminal and a second terminal, the second terminal of the tuning electrode capacitor connected directly to the first terminal of the first tuning electrode inductor, the first tuning electrode inductor directly connected in series with the tuning electrode capacitor, wherein the second terminal of the first tuning electrode inductor is directly to ground; and
   a second tuning electrode inductor having a first terminal and a second terminal, the first terminal of the second tuning electrode inductor connected directly to the first terminal of the tuning electrode capacitor and the second terminal of the second tuning inductor connected directly to the second terminal of the first tuning electrode inductor, the second tuning electrode inductor connected directly in parallel with the tuning electrode capacitor and the first tuning electrode inductor.

10. The substrate support assembly of claim 9, wherein the tuning electrode capacitor is a variable capacitor.

11. The substrate support assembly of claim 10, further comprising a sensor coupled to the tuning electrode.

12. The substrate support assembly of claim 9, wherein the tuning electrode capacitor is a first tuning electrode capacitor, the assembly further comprising a second tuning electrode capacitor in series with the tuning electrode inductor.

13. The substrate support assembly of claim 9, wherein the tuning electrode comprises a conductive mesh.

14. The plasma processing apparatus of claim 1, wherein the tuning electrode capacitor is solely in series with a second tuning electrode inductor.

15. The substrate support assembly of claim 9, wherein the second tuning electrode inductor is in sole series with the tuning electrode capacitor.

* * * * *